(12) United States Patent
Krishnan et al.

(10) Patent No.: US 6,407,428 B1
(45) Date of Patent: Jun. 18, 2002

(54) FIELD EFFECT TRANSISTOR WITH A BURIED AND CONFINED METAL PLATE TO CONTROL SHORT CHANNEL EFFECTS

(75) Inventors: Srinath Krishnan, Campbell; Judy Xilin An, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/881,978

(22) Filed: Jun. 15, 2001

(51) Int. Cl.[7] ............................................. H01L 27/01
(52) U.S. Cl. ...................................... 257/347; 257/408
(58) Field of Search ................................. 257/336, 344, 257/347, 393, 408; 438/407

(56) References Cited

U.S. PATENT DOCUMENTS

| | | | | |
|---|---|---|---|---|
| 5,719,422 A | * | 2/1998 | Burr et al. | 257/336 |
| 5,773,863 A | * | 6/1998 | Burr et al. | 257/344 |
| 5,930,642 A | * | 7/1999 | Moore et al. | 438/407 |
| 5,990,528 A | * | 11/1999 | Sundaresan | 257/393 |
| 6,093,951 A | * | 7/2000 | Burr | 257/408 |
| 6,288,425 B1 | * | 9/2001 | Adan | 257/347 |

* cited by examiner

Primary Examiner—David Nelms
Assistant Examiner—Bau Le
(74) Attorney, Agent, or Firm—Renner, Otto, Boisselle & Sklar

(57) ABSTRACT

A field effect transistor (FET) is formed on a silicon on insulator (SOI) substrate in the thin silicon layer above the insulating buried oxide layer. The channel region of the FET includes a buried and confined metal plate for controlling short channel effects without significantly increasing junction capacitance.

6 Claims, 3 Drawing Sheets

FIELD EFFECT TRANSISTOR WITH A BURIED AND CONFINED METAL PLATE TO CONTROL SHORT CHANNEL EFFECTS

TECHNICAL FIELD

The present invention generally relates to the design of field effect transistors (FETs) using silicon-on-insulator (SOI) technology and, more particularly, to an SOI FET with a structure for controlling short channel effects.

BACKGROUND OF THE INVENTION

Conventional or bulk semiconductor devices are formed in semiconductive material by implanting a well of either P-type or N-type conductivity silicon in a silicon substrate wafer of the opposite conductivity. Gates and source/drain diffusions are then manufactured using commonly known processes. These form devices known as metal-oxide-semiconductor (MOS) field effect transistors (FETs). When a given chip uses both P-type and N-type, it is known as a complimentary metal oxide semiconductor (CMOS). Each of these transistors must be electrically isolated from the others in order to avoid shorting the circuits. A relatively large amount of surface area is needed for the electrical isolation of the various transistors. This is undesirable for the current industry goals for size reduction. Additionally, junction capacitance between the source/drain and the bulk substrate increase power consumption, require higher threshold voltages, and slows the speed at which a device using such transistors can operate (e.g. degrades frequency response). These problems result in difficulties in reducing the size, power consumption, and voltage of CMOS technology devices.

In order to deal with the junction capacitance problem and improve frequency response, silicon on insulator technology (SOI) has been gaining popularity. A SOI wafer is formed from a bulk silicon wafer by using conventional oxygen implantation techniques or wafer bonding techniques to create an insulating buried oxide layer at a predetermined depth below the surface. Between the buried oxide layer and the surface of the SOI wafer is a silicon device layer in which SOI field effect transistors (FETs) and other SOI structures may be fabricated.

Referring to FIG. 1, a partially depleted SOI FET 10 is shown. The FET 10 is fabricated on an SOI wafer 12 which includes a bulk substrate 14, an insulating buried oxide layer 16, and the device layer 18. The FET 10 is fabricated within the device layer 18 and includes a source region 20 and a drain region 22 each of a first conductivity silicon and a channel region 24, of the opposite conductivity silicon, positioned between the source region 20 and the drain region 22. A gate 26 is positioned above the channel region 24 and is separated from the channel region 24 by an insulating gate oxide film 28. In operation, when a charge above a threshold voltage is applied to the gate 25, current flows from a source extension region 20' to a drain extension region 22' through a narrow depletion region 24' just beneath the gate oxide 28.

It is desirable to reduce the size of the FET 10 such that a greater quantity of such FETs may be fabricated within a particular size wafer. A problem associated with reducing the size of SOI FET structures is a reduction in the length of the depletion region 24' (distance between the source extension 20' and the drain extension 22') degrades FET performance because of a phenomenon known as the short channel effect. When the length of the depletion region 24' is on the order of 0.2 μm, the potential of both the source region 20 and the drain region 22 will cause depletion within the depletion region 24 independent of the potential of the gate 26. The depletion regions formed by potential of the source region 20 and the drain region 22 may extend entirely through the depletion region 24' permitting current to flow even though the potential of the gate 26 is below threshold potential in a phenomenon referred to as punch-through. Additionally, impact ionization within the channel region 24 caused by the floating body effect further degrades short channel performance of the FET 10.

It has been found that short channel behavior is governed by the ratio of the depletion region 24 thickness (depth below the gate oxide 28) to its length. As such, decreasing the thickness of the gate oxide region 28 enables use of a thinner depletion region 24 for improving short channel performance. However, tunneling leakage is a problem with thin gate oxide regions 28, particularly when the channel region 24 is P- conductivity silicon.

The thickness of the depletion region 24, can also be decreased by increasing the doping concentration of the channel region 24. It has been found that the thickness of the depletion region is inversely proportional to the square root of the channel doping concentration. However, increased doping concentrations tend to increase junction capacitance which degrades the FET's frequency response.

Accordingly, there is a strong need in the art for a semiconductor field effect transistor structure which can be scaled to sub-micron dimension without significant performance degradation due to short channel effect or increased junction capacitance.

SUMMARY OF THE INVENTION

A first aspect of the present invention is to provide a silicon-on-insulator (SOI) field effect transistor (FET) on an SOI wafer which includes a silicon device layer separated from a bulk silicon layer by an insulating layer of silicon dioxide. The SOI FET comprises a channel region of a first conductivity type semiconductor formed in the silicon device layer. A source region and a drain region, both of a second conductivity type semiconductor, are formed in the silicon device layer on opposing sides of the channel region. A buried and confined metal plate region is positioned within the central portion of the central channel region. The buried and confined metal plate region extends between the source region and the drain region and is separated from a top surface of the central channel region leaving a depletion region there between and is separated from a bottom surface of the channel region. A gate is positioned above the central channel region, separated from the top surface of the central channel region by a gate oxide layer, for controlling depletion within the depletion region.

The source region and the drain region may include a source extension region and drain extension region respectively. Both extension regions extending into the central channel region adjacent to the top surface of the central channel region. The buried and confined metal plate region extends between the source extension region and the drain extension region at a depth that corresponds to the depth of the source extension region and drain extension region (e.g. junction depth). More specifically, the plate region has a top surface and a bottom surface (defined by a cut-off concentration) both of which are substantially parallel with the top surface of the central channel region, and the bottom surface of the plate region is positioned at a depth corresponding to the junction depth.

In the exemplary embodiment a thickness of the plate region, between the top surface of the plate region and the bottom surface of the plate region, is between 50 and 150 angstroms, or more specifically, between 80 and 120 angstroms in thickness.

A second aspect of the present invention is to provide a method of fabricating an SOI FET. The method comprises: a) forming a body region within a device layer of a silicon on insulator wafer; b) forming a gate over a central channel region of the body region; c) forming a source region and a drain region on opposing sides of the central channel region; and d) forming a heavily doped buried and confined metal plate region within the central channel region and extending between the source region and the drain region.

The step of forming the body region may include forming an insulating trench about a periphery of the body region to isolate the body from other portions of the silicon device layer.

The step of forming the source region and the drain region may include: i) lightly doping the source region and the drain region with a conductivity enhancing impurity utilizing the gate over the central channel region as a mask of the central channel region; ii) forming spacers on the sides of the gate; and iii) doping the source region and the drain region utilizing the gate and the spacers as a mask of the central channel region. More specifically, the step of lightly doping the source region and the drain region may be performed with an implant energy which provides for the impurity atoms to implant into the source region and drain region within a source extension region and a drain extension region both adjacent to the surface of the wafer and having a junction thickness less than a thickness of the device layer. Moreover, the step doping the source region and the drain region may be performed with an implant energy which provides for the impurity atoms to implant the entire thickness of the source region and drain region.

The step of forming the heavily doped buried and confined plate region may include utilizing an implant energy which concentrates the impurity atoms at a depth below the surface of the wafer which corresponds to the junction depth of the source extension region and the drain extension region. The thickness of the concentration region of the impurity atoms may be between 50 and 150 angstroms in thickness, and, more specifically, may be between 50 and 150 angstroms in thickness.

DESCRIPTION OF THE PREFERRED EMBODIMENT

Figure 1:
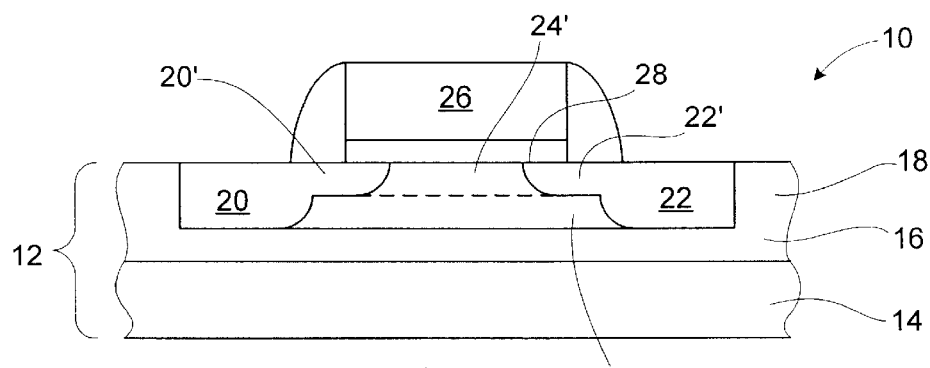
FIG. 1 is a cross-sectional view of a conventional FET fabricated using SOI technology.
Figure 2:
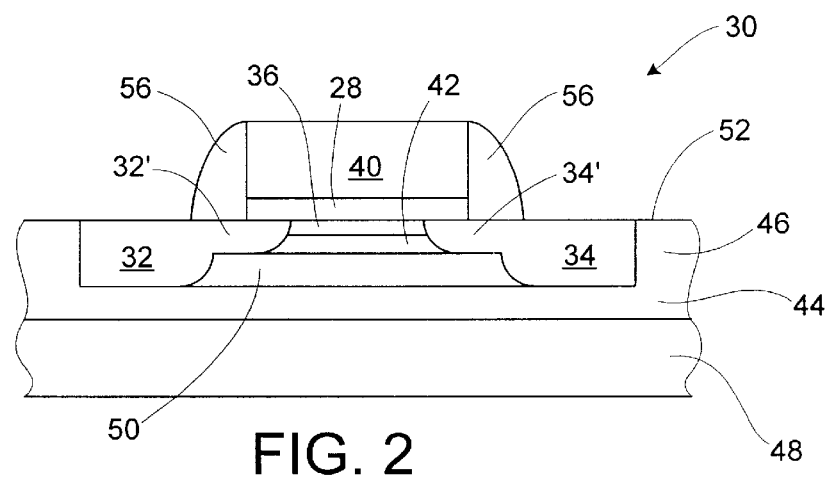
FIG. 2 is a cross-sectional view of an SOI FET in accordance with one embodiment of the present invention.

The present invention will now be described in detail with reference to the drawings. Referring to FIG. 2, a partially depleted silicon on insulator (SOI) FET 30 is shown in accordance with this invention.

FET 30 includes a lightly doped P-conductivity body region 50 separating an N-conductivity source region 32 and an N-conductivity drain region 34. The source region 32 and the drain region 34 extend from the surface of the wafer 52 to a buried oxide layer 44. The profile of both the source region 32 and the drain region 34 is such that a thin source extension region 32' and a thin drain extension region 34' extend into the body region 50 just beneath the surface 52. The portion of the body region 50 which is between the source extension region 32' and the drain extension 34' is a depletion region 36. Above the depletion region 36 is an insulating gate oxide layer 28 and an N+silicon gate 40.

Within the body region 50 positioned just below the depletion region 36 and at the same depth as each of the source extension region 32' and the drain extension region 34' is a buried and confined metal plate region 42. The metal plate region 42 extends between the bottom of the source extension region 32' and the bottom of the drain extension region 34'. The metal plate region 42 has a thickness on the order of 100 Angstroms and is heavily P- doped (e.g. doping concentration on the order of $1 \times 10^{19}$ atoms per $cm^3$.

It should be appreciated that a charge on either (or both) of the source region 32 and the drain region 34 may cause depletion along the source junction and drain junction respectively. The metal plate region 42, with the high doping concentration, prevents such depletion from extending entirely across the depletion region 36 thereby limiting short channel effect. More specifically, the metal plate region 42 can support a higher depletion charge per unit of cubic volume so that the total volume of the depletion region caused by the source region 32 and the drain region 34 is minimized. Because the metal plate region 42 is very thin, the junction between the high doping concentration plate region 42 and each of the source region 32 and the drain region 34 is very small. As such, junction capacitance is not significantly increased as it would be if the entire body region were heavily doped.

Figure 3A:
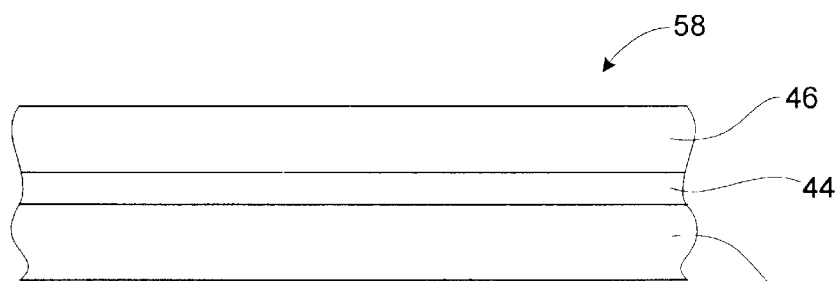
FIG. 3a is a cross section diagram showing a step in the fabrication of the SOI FET in accordance with this invention.
Figure 3B:
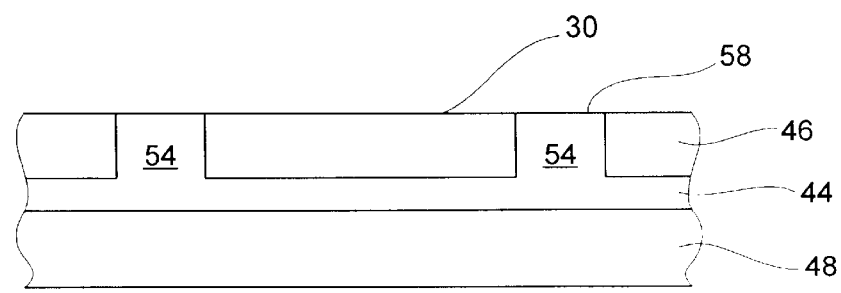
FIG. 3b is a cross section diagram showing a step in the fabrication of the SOI FET in accordance with this invention.
Figure 3C:
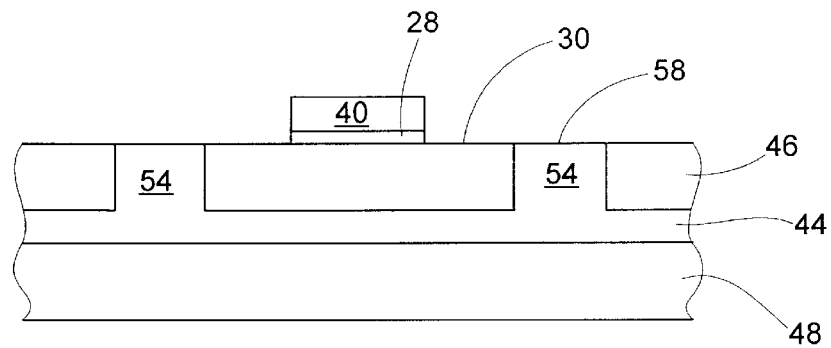
FIG. 3c is a cross section diagram showing a step in the fabrication of the SOI FET in accordance with this invention.
Figure 3D:
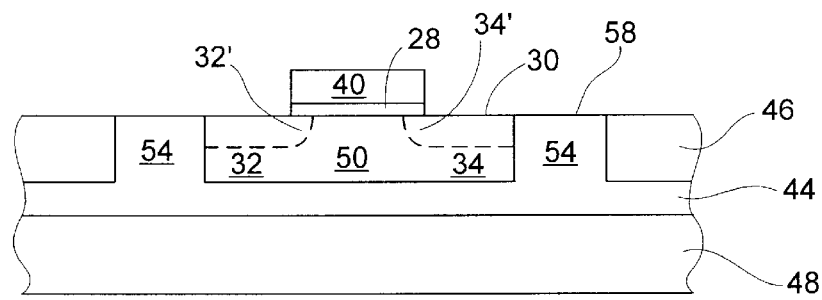
FIG. 3d is a cross section diagram showing a step in the fabrication of the SOI FET n accordance with this invention.
Figure 3E:
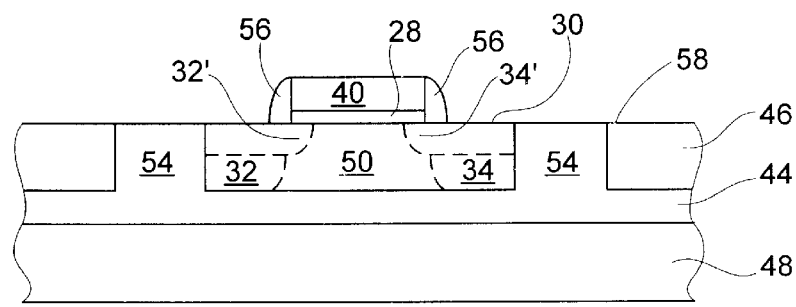
FIG. 3e is a cross section diagram showing a step in the fabrication of the SOI FET in accordance with this invention.
Figure 3F:
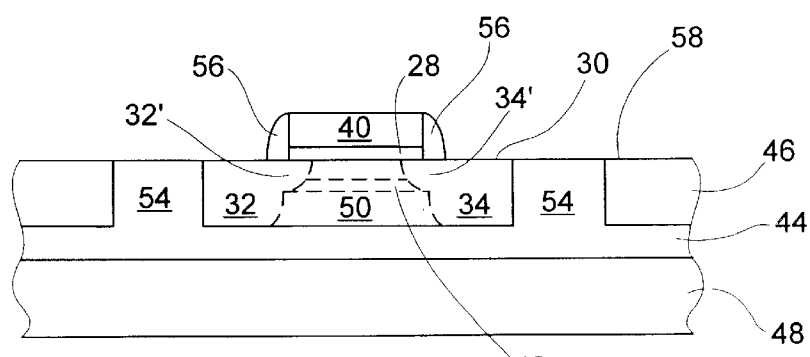
FIG. 3f is a cross section diagram showing a step in the fabrication of the SOI FET in accordance with this invention.
Figure 4:
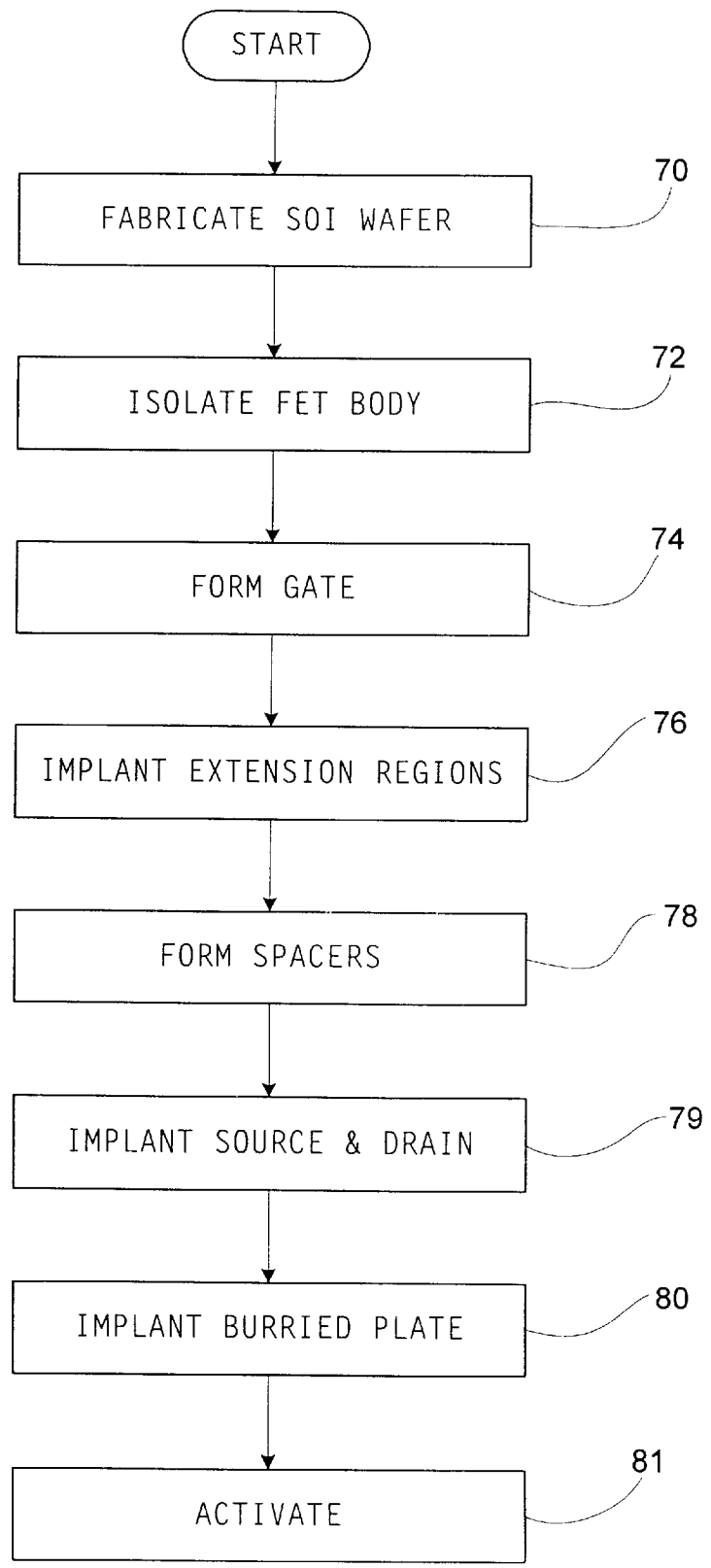
FIG. 4 is a flow chart showing exemplary processing steps in the fabrication of the SOI FET in accordance with this invention.

Referring to the flowchart of FIG. 4 in conjunction with the cross sectional diagrams of FIG. 3a–FIG. 3f, exemplary processing steps for fabricating FET 30 are shown. Step 70 represents fabricating an SOI wafer 58 with the insulating buried oxide layer 44 separating the silicon device layer 46 from the base substrate 48 as shown in FIG. 3a. Common methods for fabricating an SOI wafer include a separation by implantation of oxygen (SIMOX) process in which oxygen is implanted into a bulk wafer at the desired depth and a wafer bonding process in which two wafers are bonded together with the oxide layer sandwiched there between and one of the two wafers is then polished (or cut using a SmartCut® process) to the desired device layer thickness.

Step 72 represents isolating the FET 30 from other structures which may be fabricated in the silicon device layer 46. Isolation is accomplished by etching an insulating trench 54 into the silicon device layer 46 about the periphery of FET 30 and filling the insulating trench 54 with an insulating compound as shown in FIG. 3b. More specifically, etching the insulating trench 54 may be accomplished by forming a silicon nitride mask over the surface of the SOI wafer 58 to define and expose the area corresponding to the insulating trench 54. A layer of silicon nitride is then formed by depositing a layer of silicon nitride on the top surface of the SOI wafer and patterning and etching the silicon nitride using conventional photolithography techniques to form a silicon nitride mask over FET 30. Once masked, an anisotropic etch with a etching compound such as hydrogen bromide (Hbr) is preferably used to etch the insulating trench 54 in the region.

After etching the insulating trench 54, the silicon nitride mask can be removed using a wet chemical mechanical polish and the insulating trench filled with an insulating compound such as silicon dioxide. Conventional filling techniques may include filling the trench 54 with a compound such as SiH4 or TEOS and performing a thermal oxidization to oxidize such compound to form silicon dioxide. Other back filling techniques known to those skilled in the art may also be used.

Step 74 represents forming a polysilicon gate 40 over the central region of the FET 30 as is shown in FIG. 3c. More specifically, a conventional thermal oxidation process is used to grow a gate oxide layer 28 (comprising silicon dioxide), on the surface of the wafer 58. A layer of polysilicon is deposited on the surface of the gate oxide layer 28 using low pressure chemical vapor deposition (LPCVD) as is known by those skilled in the art. Conventional photolithography techniques are then used to pattern and mask the polysilicon gate 40 and anisotropic etching techniques are used to remove un-masked polysilicon thereby forming the polysilicon gate 40.

Step 76 represents lightly doped drain (LDD) implant of the source region 32 and the drain region 34 with a conductivity enhancing impurity of the same conductivity as the source region 32 and drain region 34 (e.g. opposite conductivity as the channel region 50) to form the source extension 32' and the drain extension 34' as is shown in FIG. 3d. More specifically step 76 represents implanting an n-conductivity impurity such as phosphorus or arsenic with a dosage of about $1 \times 10^{14}$ to $1 \times 10^{16}$ atoms/cm$^2$ and a energy of about 500 eV to 10 KeV.

Step 78 represents forming insulating spacers 56 along the sides of the polysilicon gate 40. Spacers 56 may be formed by depositing a layer of silicon nitride or silicon dioxide approximately 300 to 1000 angstroms in thickness over the entire surface of the waver 30 and subsequently anisotropically etching the deposited layer to expose the top surface of the polysilicon gate 40 and the top surface of each of the source region 32 and the drain region 34 while leaving spacers 56.

After formation of the spacers 56, step 79 represents implanting the source region 32 and the drain region 34 with an n-conductivity impurity such as phosphorus or arsenic. The polysilicon gate 40 functions to define and mask the central channel region 50 of the FET 30 during implant of the source region 32 and drain region 34.

Step 80 represents formation of the buried and confined metal plate 42. More specifically, formation of the buried and confined metal plate 42 includes a pre amorphize step with a heavy species such as Ge or Si followed by an implant step with a species such as BF2/Boron or Indium at a dosage of $1 \times 10^{12}$ to $1 \times 10^{14}$ atoms per cm$^3$ within the metal plate region 42. Step 81 represents activation with a solid phase epitaxy process.

The FET structure in accordance with this invention provides for reducing short channel effects without significantly increasing junction capacitance thereby permitting fabrication of FETs which are smaller and have a better frequency response. Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A silicon-on-insulator field effect transistor comprising:
   a) a channel region of a first conductivity type semiconductor formed in a silicon layer over an insulator layer;
   b) a source region and a drain region both of a second conductivity type semiconductor formed in the silicon layer on opposing sides of the channel region,
      i) the source region including a source extension region extending into the channel region adjacent to a top surface of the channel region and having a depth below the top surface that is less than a thickness of the silicon layer;
      ii) the drain region including a drain extension region extending into the channel region adjacent to the top surface of the channel region and having a depth below the top surface that is less than a thickness of the silicon layer;
   c) a plate region within a central portion of the channel region extending between the source extension and the drain extension, separated from both the top surface of the channel region and the bottom surface of the channel region, and extending between the source region and the drain region wherein the plate region includes a top surface and a bottom surface both of which are substantially parallel with the top surface of the central channel region and the bottom surface of the plate region is positioned at a depth corresponding to the depth of the source extension region and the drain extension region; and
   d) a gate positioned above the channel region, separated from the top surface of the channel region by a gate oxide layer, and controlling depletion within a portion of the central channel region between the plate region and the top surface of the central channel region.

2. The silicon-on-insulator field effect transistor of claim 1, wherein a thickness of the plate region between the top surface of the plate region and the bottom surface of the plate region is between 50 and 150 angstroms in thickness.

3. The silicon-on-insulator field effect transistor of claim 2, wherein a thickness of the plate region between the top surface of the plate region and the bottom surface of the plate region is between 80 and 120 angstroms in thickness.

4. A semiconductor device including a plurality of field effect transistors formed on a semiconductor substrate, the device comprising:
   a) an insulating oxide layer positioned within the semiconductor substrate and separating a device layer portion of the semiconductor substrate form a bulk portion of the semiconductor substrate;
   b) an insulating trench pattern positioned within the device layer and isolating each of the plurality of field effect transistors and each of the plurality of field effect transistors comprises:
      i) a channel region of a first conductivity type semiconductor formed in a silicon layer over an insulator layer;
      ii) a source region and a drain region both of a second conductivity type semiconductor formed in the silicon layer on opposing sides of the channel region;

the source region including a source extension region extending into the channel region adjacent to a top surface of the channel region and having a depth below the top surface that is less than a thickness of the silicon layer;

the drain region including a drain extension region extending into the channel region adjacent to the top surface of the channel region and having a depth below the top surface that is less than a thickness of the silicon layer;

iv) a plate region extending between the source extension and the drain extension within a central portion of the channel region, separated from both a top surface of the channel region and a bottom surface of the channel region, and extending between the source region and the drain region; wherein the plate region includes a top surface and a bottom surface both of which are substantially parallel with the top surface of the central channel region and the bottom surface of the plate region is positioned at a depth corresponding to the depth of the source extension region and the drain extension region; and v) a gate positioned above the channel region, separated from the top surface of the channel region by a gate oxide layer, and controlling depletion within a portion of the channel region between the plate region and the top surface of the channel region.

5. The semiconductor device of claim 4, wherein a thickness of the plate region between the top surface of the plate region and the bottom surface of the plate region is between 50 and 150 angstroms in thickness.

6. The semiconductor device of claim 5, wherein a thickness of the plate region between the top surface of the plate region and the bottom surface of the plate region is between 80 and 120 angstroms in thickness.

* * * * *